(12) United States Patent
Yamamoto

(10) Patent No.: US 6,566,154 B2
(45) Date of Patent: May 20, 2003

(54) METHOD FOR MANUFACTURING LIQUID CRYSTAL DISPLAY DEVICE

(75) Inventor: Yuji Yamamoto, Izumi (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/160,071

(22) Filed: Jun. 4, 2002

(65) Prior Publication Data

US 2002/0182766 A1 Dec. 5, 2002

(30) Foreign Application Priority Data

Jun. 4, 2001 (JP) ........................................ 2001-168009

(51) Int. Cl.⁷ .......................... H01L 21/00; H01L 21/84
(52) U.S. Cl. ........................... 438/30; 438/149; 438/155
(58) Field of Search ............................ 438/30, 149–166

(56) References Cited

U.S. PATENT DOCUMENTS 5,834,327 A * 11/1998 Yamazaki et al. ............ 438/30
6,413,838 B2 * 7/2002 Itoh ........................... 438/462
2002/0030189 A1 * 3/2002 Ishikawa ...................... 257/59
2002/0094639 A1 * 7/2002 Reddy ......................... 438/257
2002/0102783 A1 * 8/2002 Fujimoto et al. ............ 438/200
2002/0110944 A1 * 8/2002 Kian et al. .................... 438/30
2002/0187594 A1 * 12/2002 Yamazaki et al. .......... 438/166

FOREIGN PATENT DOCUMENTS

| JP | 9-116158 | 5/1997 |
| JP | 11-212116 | 8/1999 |

* cited by examiner

*Primary Examiner*—John F. Niebling
*Assistant Examiner*—Jennifer M. Kennedy
(74) *Attorney, Agent, or Firm*—Young & Thompson

(57) ABSTRACT

A plastic substrate is employed as a counter substrate that constitutes one of two substrates of a liquid crystal panel. To form such a liquid crystal panel, the counter substrate consisting of the plastic substrate is manufactured in a situation where a glass substrate is adhered to the plastic substrate as a support substrate for the plastic substrate in the steps ranging from the step for forming the common electrode on the plastic substrate to the step prior to the step for cutting and dividing the counter substrate into the liquid crystal panel units. Accordingly, the plastic substrate can be processed in the same method as that could be employed to process a glass substrate.

6 Claims, 4 Drawing Sheets

METHOD FOR MANUFACTURING LIQUID CRYSTAL DISPLAY DEVICE

BACKGROUND OF THE INVENTION

1. Field of the Invention

The present invention relates to a method for manufacturing a liquid crystal display device, and more particularly to a method for manufacturing a liquid crystal display device that employs a plastic substrate to make a liquid crystal panel lighter and thinner.

2. Description of the Related Art

In terms of actual use of a liquid crystal display device, particularly a portable information terminal device or a portable telephone employing the liquid crystal display device therein, one of critical problems to be solved is to make a liquid crystal panel light-weighted and thin.

Efforts have been vigorously made to overcome such problems by reducing the density of a glass substrate or by making the thickness of the glass substrate thin. When glass density is reduced, a silicon dioxide ($SiO_2$) mainly constituting a glass decides substantially all physical property values of glass and hence, a technique to further lower the glass density faces its limit, resulting in difficulty in further reducing the glass density. On the other hand, when the plate thickness is made thin, the strength of the glass substrate is drastically degraded so that facilities in a manufacturing line are to forcibly be changed to a large extent and further, the physical resistance against external forces becomes lowered. Accordingly, it is said that the thickness of the glass substrate can at most be made 0.4 to 0.5 mm as its minimum value.

As a liquid crystal panel achieving lightness and thin structure thereof, a so-called simple-matrix-type monochrome liquid crystal panel not employing active elements such as a TFT (Thin Film Transistors) for driving liquid crystal is exemplified. In such a liquid crystal panel, material which constitutes a matrix is formed of transparent electrode material referred to as ITO and is formed at a relatively low temperature and hence, it is possible to use a plastic substrate or the like as a base substrate on which the transparent electrode material is formed. Actually, the plastic substrate having such construction has been used in the portable information terminal device and the portable telephone.

As for a trend of the liquid crystal display panel, there has been observed a phenomenon that an amount of information which can be processed as display information has been increasing in accordance with improvement in performances of the recent portable terminal equipment and then, the image to be displayed has been changing from a monochrome one and a still picture to a color one and a motion picture, respectively.

However, the simple matrix-type liquid crystal display device employs an STN (Super Twisted Nematic) liquid crystal mode as a liquid crystal driving mode and hence, the simple matrix-type liquid crystal display device has the following disadvantages. That is, comparing with an active matrix type liquid crystal display device, which employs a TN (Twisted Nematic) liquid crystal mode and TFTs, and is used in a notebook type personal computer or a monitor, both being popularly and widely used, the simple matrix-type liquid crystal display device does not provide a user with sufficient quality of images to be displayed, so that gray-scale display deteriorates or the user feels residual images In consideration of the above-described problems, the following techniques have been developed and are disclosed such as in Japanese Laid-open Patent Publication 212116/1999 and Japanese Laid-open Patent Publication 116158/1997. That is, active elements such as a TFT element are formed on a plastic substrate. In the former publication, the active elements are formed on a glass substrate and then, a plastic substrate is attached to the surface of the glass substrate on a side thereof on which the elements are located, and further, a portion of the glass substrate on a side thereof on which the elements are not located, is polished in a direction of the thickness of the substrate to remove the glass substrate. In the latter publication, active elements are formed on a plastic substrate or a glass substrate having a thickness of not greater than 0.5 mm. However, many technical problems to be solved still have been found in a device employing a plastic substrate and further, such device requires expensive facilities, thereby preventing the device from being put into practical use.

In a liquid crystal display device having color filters together with active elements on a plastic substrate, the plastic substrate on which the color filters are formed exhibits the poor resistance against heat and solvent and hence, pigments and solvents available for use as a color filter are limited, whereby the color reproducibility cannot sufficiently be achieved. Accordingly, development of a liquid crystal display device having the following construction and advantages has been strongly required. That is, a liquid crystal display device is formed lighter and thinner, and further formed to operate in the same manner as in a case where a color and active matrix liquid crystal panel operates in a TN liquid crystal mode.

Furthermore, even in a case where a plastic substrate is employed to make a liquid crystal display device lighter and thinner, the plastic substrate has problems other than poor resistance against heat and solvent in that the plastic substrate is easily deformed and therefore, it is so difficult to process the plastic substrate in steps for manufacturing a liquid crystal panel compared to the case where a glass substrate is processed.

SUMMARY OF INVENTION

Accordingly, it is an object of the present invention to provide a method for manufacturing a liquid crystal display device in which a TFT substrate is employed and a liquid crystal can be formed simultaneously lighter and thinner.

A method for manufacturing a liquid crystal display device according to the present invention is constructed as follows. That is, the method comprises:

a step for disposing a TFT substrate and a counter substrate facing the TFT substrate apart a predetermined distance from each other; and a step for filling a space between the TFT substrate and the counter substrate with a liquid, in which the liquid crystal display device is constructed such that at least one of the TFT substrate and the counter substrate consists of a plastic substrate, the method further being constructed such that the method comprises a substrate separation step for cutting and dividing a combined substrate consisting of the TFT substrate and the counter substrate, both substrates interposing the liquid crystal therebetween, into substrate units, and one of surfaces of the plastic substrate is supported by a support substrate until the combined substrate is cut and divided.

As described above, by using a plastic substrate as one of two substrates that constitute a liquid crystal panel in a method for manufacturing a liquid crystal display device, compared to a case in which a glass substrate having a thickness equal to that of the plastic substrate is used in a liquid crystal panel., the liquid crystal panel can be made light-weighted. Furthermore, in a case where the plastic substrate is made to have the same resistance against collision as that of the glass substrate, the thickness of the plastic substrate can be reduced compared to that of the glass substrate, thereby allowing a liquid crystal panel to have a thinner thickness.

The above-described method has the following detailed construction. That is, a method for manufacturing the TFT substrate comprises:

a step for forming a thin film transistor and a wiring on a first substrate;

a step for depositing a protective film covering the thin film transistor and the wiring on the first substrate;

a step for forming a color layer corresponding to the thin film transistor and a black matrix shielding light from being irradiated onto the thin film transistor on the protective film;

a step for depositing a flattening film covering the color layer and the black matrix on the protective film;

a step for opening a part of the protective film and the flattening film to form a contact hole reaching a source electrode of the thin film transistor in the protective film and the flattening film;

a step for forming a transparent pixel electrode covering the contact holes and connected to the source electrode on the the flattening film;

a step for forming a spacer on the flattening film;

a step for forming an orientation film covering the transparent pixel electrode and the spacer on the flattening film, and subsequently, rubbing the orientation film;

a step for forming a seal material to surround a predetermined region on the orientation film; and a step for dropping a liquid crystal into the region surrounded by the seal material constituting the orientation film, and a method for manufacturing the counter substrate comprises:

a step for covering a second substrate with a transparent electrode and adhering a support substrate to a surface of the second substrate, the surface being located on a side of the second substrate opposite to the transparent electrode; and a step for forming a material for an orientation film on the transparent electrode, and sequentially, rubbing the orientation film, and the method for manufacturing a liquid crystal display device further comprises:

a step for disposing the TFT substrate and the counter substrate overlapping each other such that the orientation films of the TFT substrate and the counter substrate face each other, and then, making the orientation film of the counter substrate contact the spacer and the seal material of the TFT substrate;

a step for curing the seal material to make the TFT substrate and the counter substrate adhere to each other, thereby forming a semi-completed panel;

a step for removing the second substrate from the support substrate, a step for cutting and dividing the semi-completed panel into panel units; and a step for attaching a polarizer to a surface of at least the first substrate out of the first and second substrates constituting the panel unit, the surface being located opposite to the liquid crystal, and the support substrate being previously attached to a surface of the second substrate, the surface being located opposite to the transparent electrode, before the step for forming the transparent electrode on the second substrate.

Furthermore, the above-described detailed method has the following additional construction. That is, the polarizer is attached only to the surface of the first substrate in the step for attaching a polarizer to a surface of at least the first substrate out of the first and second substrates constituting the panel unit, the surface of at least the first substrate being located opposite to the liquid crystal, and the second substrate is formed of a polarizer-cum-plastic substrate.

As described above, employing a polarizer-cum-plastic substrate as the second substrate out of the first and second substrates makes it possible to form a second substrate thinner than that could be achieved by use of a glass substrate and thereby form a liquid crystal panel further thinner.

DESCRIPTION OF THE PREFERRED EMBODIMENTS

Figure 1:
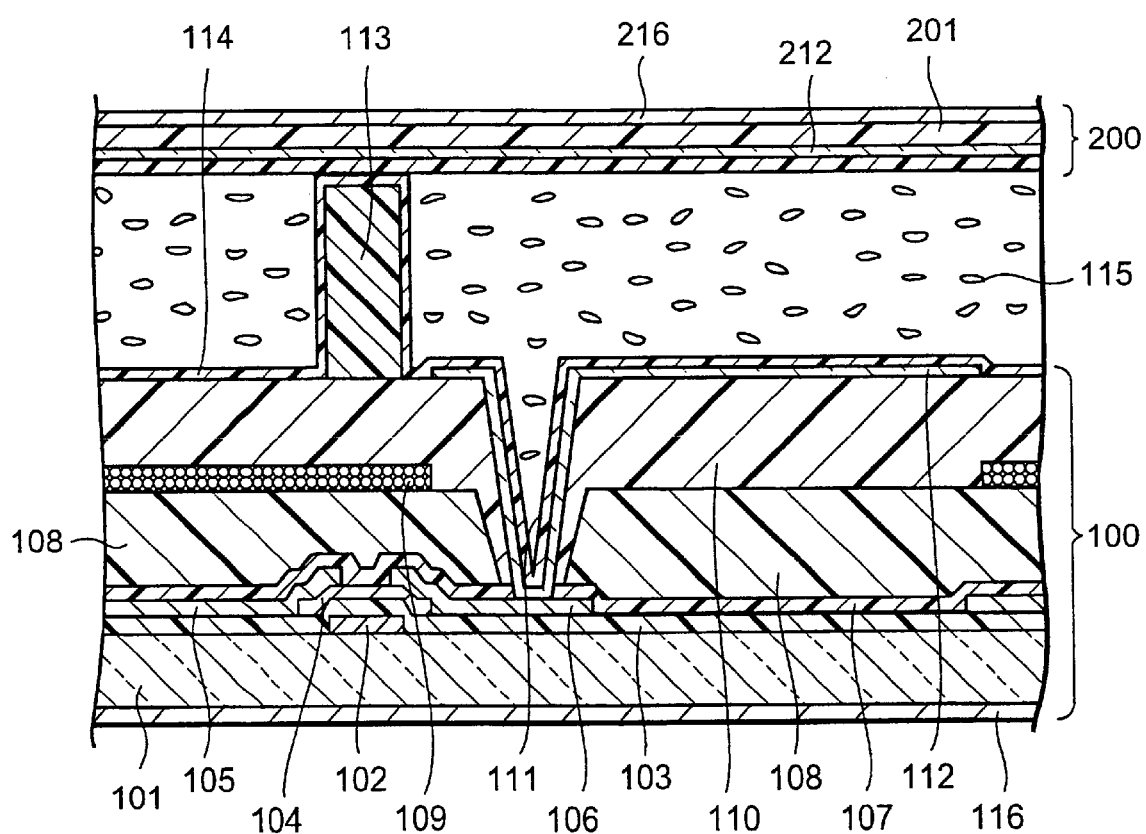
FIG. 1 is a cross-sectional view of a liquid crystal panel formed using the first embodiment of the present invention.

The first embodiment of the present invention will be explained referring to FIG. 1. FIG. 1 is a cross-sectional view of a liquid crystal panel, cut along a plane passing just through a TFT on a TFT substrate, the plane being perpendicular to the substrate.

As shown in FIG. 1, a color filter 108 and a black matrix 109 are formed on a TFT through exposure or the like and a pixel electrode 112 and a columnar spacer 113 are formed on the color filter and the black matrix via an overcoat 110, thereby forming a TFT substrate 100. A counter substrate 200 facing the TFT substrate 100 is formed by forming a counter electrode 212 on a plastic substrate 201.

With the use of the plastic substrate 201, compared to a case in which a glass substrate having a thickness equal to that of the plastic substrate 201 is used, the liquid crystal panel can be made light-weighted. Furthermore, in a case where the plastic substrate 201 is made to have the same resistance against collision as that of the glass substrate, the thickness of the plastic substrate can be reduced compared to that of the glass substrate, thereby allowing a liquid crystal panel to have a thinner thickness.

An amorphous silicon (a-Si) layer 104 is formed on a glass substrate 101 of the TFT substrate 100. On the a-Si layer 104 are formed the color filter 108 and the black matrix 109, and the overcoat 110 is further formed covering the color filter and the black matrix. Further, in a contact hole 111 formed in the overcoat 110 is formed the pixel electrode 112 made of a transparent metal. The TFT substrate 100 having the above-mentioned films are disposed facing the counter substrate 200 via the columnar spacer 113 while being spaced a distance of several micron meters apart from the counter substrate and interposing a liquid crystal 115 between the TFT substrate 100 and the counter electrode 200.

In the liquid crystal panel constructed as described above, the plastic substrate 201 is made of polycarbonate, polyethersulfone, polyarylate or the like. Since the plastic substrate 201 exhibits specific gravity smaller than that of a glass substrate having the same thickness as that of the plastic substrate, the liquid crystal display device can be made light-weighted. Furthermore, in a case where the plastic substrate is made to have the same resistance against collision as that of the glass substrate, the thickness of the plastic substrate can be reduced compared to that of the glass substrate, thereby allowing a liquid crystal panel to have a thinner thickness.

Figure 2:
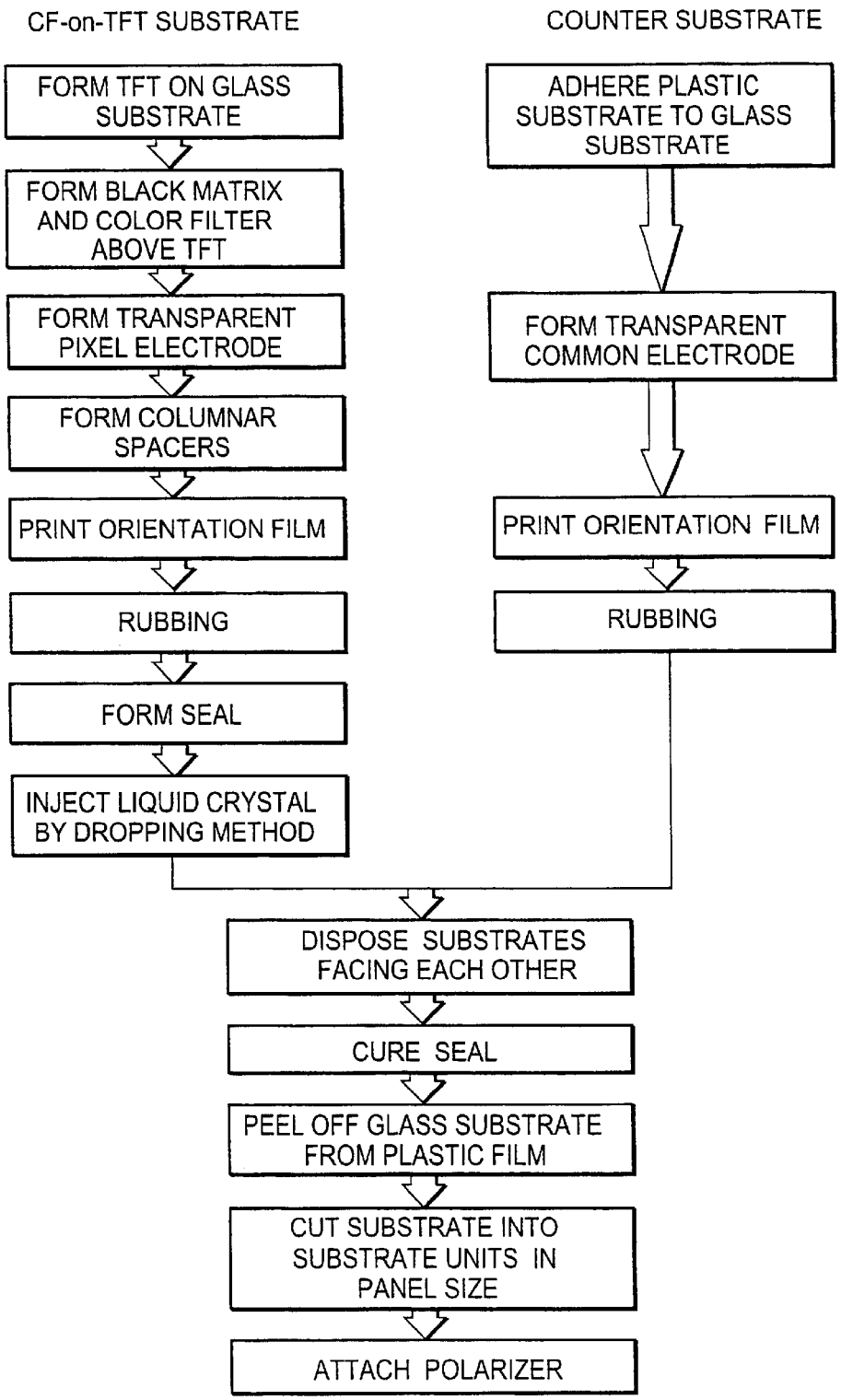
FIG. 2 is a manufacturing step flow chart, which shows a method for manufacturing a liquid crystal display device of the first embodiment of the present invention.

The counter substrate employing the plastic substrate 201 of this embodiment is assembled into a panel through manufacturing steps shown in FIG. 2. One exemplified method for manufacturing a liquid crystal panel having a plastic substrate as a counter substrate will be explained referring to FIG. 1.

First, in the TFT substrate 100, a gate electrode 102, a gate insulation film 103, an a-Si layer 104, a data line 105 and a source electrode 106, a passivation film 107, a color filter 108, a black matrix 109, an overcoat 110, a contact hole 111 and a pixel electrode 112 made of a transparent metal are sequentially formed on the glass substrate 101.

In the TFT substrate 100, before forming the pixel electrode 112, a color resist made of a photosensitive acrylic resin is applied using a spin coating method or a printing method to form the color resist to have uniform film thickness and, thereafter, exposure, development and baking are performed with respect to respective colors thus sequentially forming the color filters 108 at given positions.

Subsequently, a black resist made of a photosensitive acrylic resin is coated on a predetermined area using a coating method similar to that of the color resist and is patterned to form the black matrix 109.

Subsequently, a transparent resist as an overcoat (organic interlayer insulation film) 110 made of a photosensitive acrylic resin is coated on a predetermined area using a coating method similar to that of the color resist and the contact hole 111 is formed by opening a portion of the overcoat 110 together with the passivation film 107 on the source electrodes 106. Then, the pixel electrode 112 made of a transparent metal is formed covering the contact hole 111 to connect the pixel electrode 112 and the source electrode 106 to each other.

Furthermore, photosensitive acrylic rein having a film thickness substantially equal to a gap necessary for formation of a panel is coated on the overcoat 110 and is temporarily baked at a temperature of 60 to 120 degree centigrade, and is subjected to exposure using a mask to form a predetermined pattern in the resin. Thereafter, the exposed resin is subjected to development and then, to baking at a temperature of 200 to 250 degree centigrade to form a columnar spacer 113 having a predetermined profile.

A method for manufacturing the counter substrate 200 is explained hereinafter.

First, a plastic substrate 201 having a film thickness of 0.1 to 0.7 mm is fixed to a glass substrate having a plate thickness of 0.4 to 1.1 mm (not shown) by adhesive bonding, negative pressure suction (method for generating negative pressure to suction the plastic substrate) or the like. A thickness of the glass substrate is optionally selected such that an aggregate thickness of the glass and plastic substrates after the plastic substrate is attached to the glass substrate does not require a specific modification of manufacturing steps. Furthermore, when the glass substrate and the plastic substrate are adhered to each other, a re-peelable pressure sensitive adhesive (pressure-sensitive adhesive which facilitates peel-off) such as a cellophane tape or a seal selected from a group of materials such as a natural-rubber-based adhesive, an acrylic adhesive, a synthetic-rubber-based adhesive, a silicone-based adhesive is applied to a surface of the glass substrate on a side thereof on which an adhesive should be located by a spin coating, a printing method or the like and, thereafter, the plastic substrate 201 is adhered to the glass substrate. Note that silicone or the like may be applied to a surface of the plastic substrate 201 on which an adhesive should be located to facilitate peeling off performed in a later step. Furthermore, the glass substrate and the plastic substrate 201 are not required to have the same area and the plastic substrate 201 may be made slightly larger than the glass substrate to facilitate the peeling off in a later step.

Subsequently, the common electrode 212 made of a transparent metal is formed on the plastic substrate 201 by performing a vacuum sputtering or by applying a transparent resist containing ITO particles or the like to the plastic substrate 201. In this case, the heat treatment for transforming the deposited or applied film from the amorphous state to the crystalline state is performed at a temperature of not greater than the heat-resistant temperature of the plastic substrate 201 regardless of a state of film, i.e., during and after formation of film.

Subsequently, a method for assembling the TFT substrate 100 and the counter substrate 200 in manufacturing steps of panel is explained.

First, a material made of polyimide or the like for an orientation film is uniformly applied by printing, coating or the like to predetermined areas to have a predetermined film thickness and, then, baked, the predetermined areas being the surfaces of the TFT substrate 100 and the counter substrate 200 on sides thereof on which a liquid crystal located, in more detail, on which the pixel electrode 112 and the common electrode 212 are located, respectively. In this case, the baking is performed at a temperature of not greater than the heat-resistant temperature of plastic at least with respect to the plastic substrate 201.

Subsequently, to align the liquid crystal in a constant direction, the materials for the orientation films formed on the surfaces of respective substrates are rubbed with a cloth or the like so as to form the orientation films 114 (rubbing treatment).

Thereafter, a seal material of an ultraviolet curing type is drawn on the TFT substrate 100 by a dispenser method and the liquid crystal 115 is filled in a region surrounded by the seal by injecting the liquid crystal using a dropping technique. Although an example in which the seal is formed on the TFT substrate 100 and the liquid crystal 115 is filled in the region surrounded by the seal is described in this embodiment, the method is not limited to such an example and the seal may be formed on the counter substrate 200 and the liquid crystal 115 may be filled in a region defined by the seal.

Then, the counter substrate 200 is disposed overlapping the TFT substrate 100 in which the liquid crystal 115 is filled and ultra-violet rays are irradiated to the seal portion from a side of the counter-substrate 200 to cure the seal.

Thereafter, the glass substrate adhered to the plastic substrate 201 is removed from the plastic substrate 201 in the following manner. That is, in the case where the glass substrate is fixed to the plastic substrate 201 by adhesion, the glass substrate is removed from the plastic substrate 201 in such a manner that an end portion of the glass substrate and an end portion of the plastic substrate 201 are made apart from one another in directions opposite to each other, which operation is an operation similar to that could be observed in peeling off the cellophane tape and the seal. On the other hand, in the case where the glass substrate is fixed to the plastic substrate 201 by negative pressure suction, the glass substrate and the plastic substrate 201 are made apart from each other by breaking the negative pressure into an air pressure in a nondestructive manner. Thereafter, the substrate consisting of the TFT substrate 100 and the counter substrate 200 adhered to each other is cut into specific size of substrates and a polarizer 116 for a TFT substrate and a polarizer 216 for a counter substrate are respectively adhered to surfaces of the substrates on sides thereof opposite to opposing surfaces of the substrates, thus completing formation of liquid crystal panel. Note that the glass substrate removed from the plastic substrate in a nondestructive manner is available for re-use after cleaning the surface of the glass substrate. In this case, the adhesive or the like adhered to the glass substrate is removed using an alcohol-based or petroleum-based organic solvent.

As described above, according to the manufacturing steps for completing formation of the counter substrate 200 consisting of the plastic substrate 201, in the steps ranging from the step for forming the common electrode on the plastic substrate 201 to the step prior to the step for cutting and dividing the counter substrate 200 into the liquid crystal panel units, the glass substrate is adhered to the plastic substrate as a support substrate for the plastic substrate. Accordingly, the bending of plastic substrate adversely affecting steps for manufacturing a liquid crystal panel can be prevented, thereby allowing a plastic substrate to be processed in the same method as that could be employed to process a glass substrate.

Figure 3:
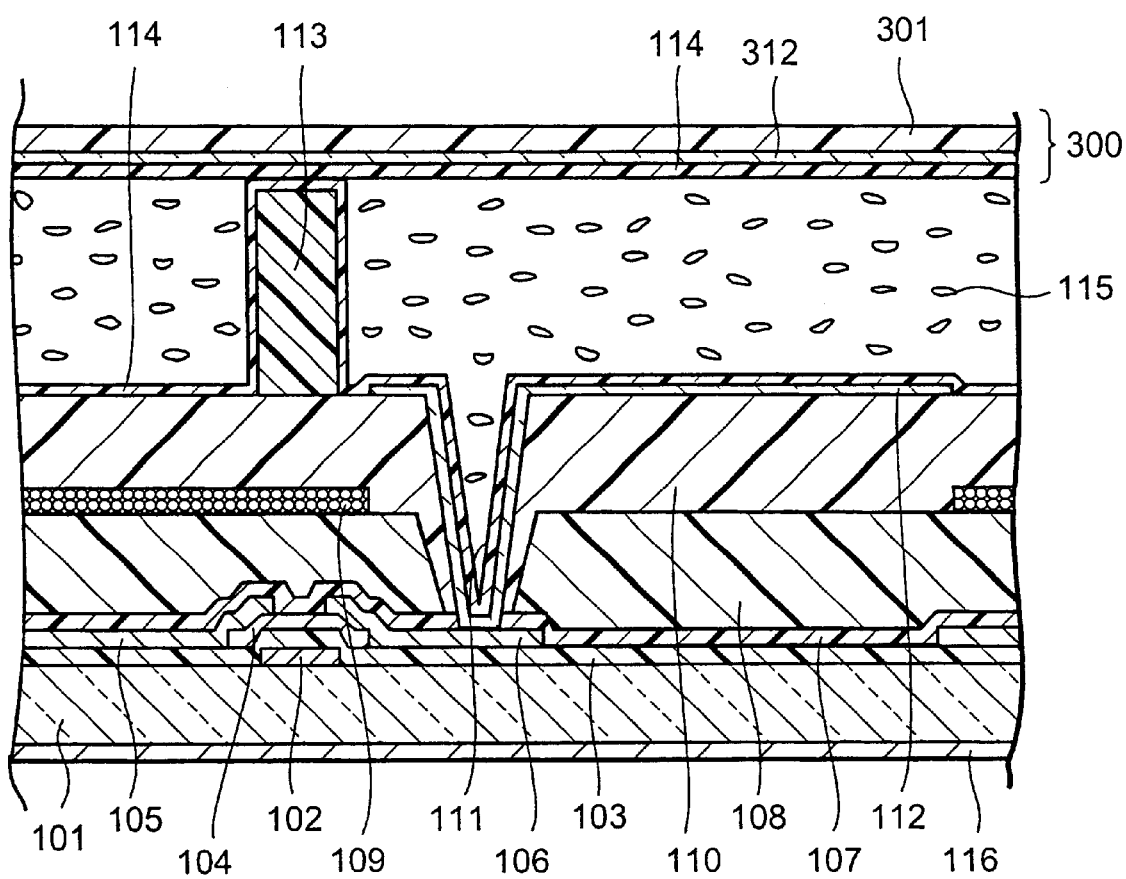
FIG. 3 is a cross-sectional view of a liquid crystal display device formed using the second embodiment of the present invention.
Figure 4:
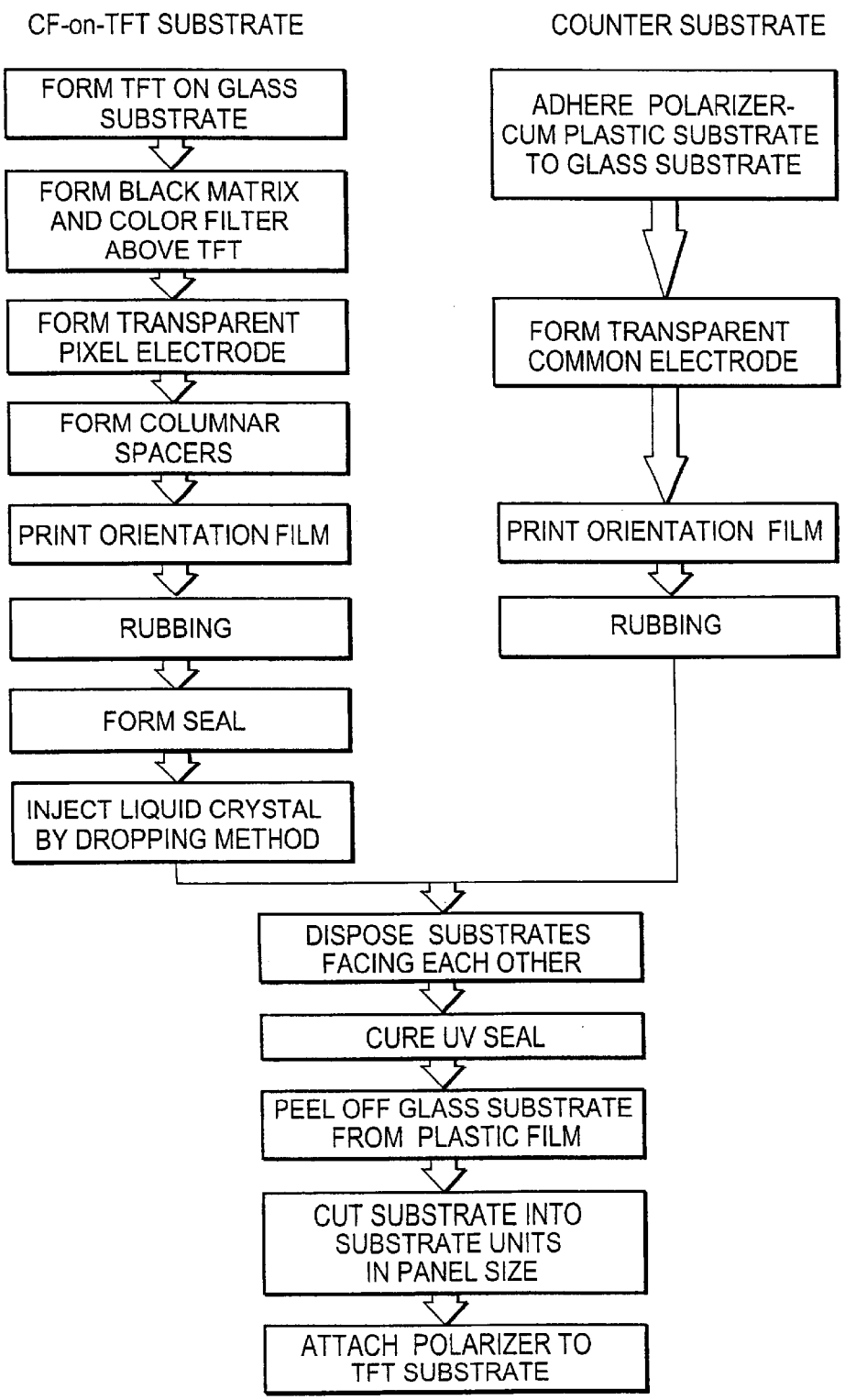
FIG. 4 is a manufacturing step flow chart, which shows a method for manufacturing a liquid crystal display device of the second embodiment of the present invention.

The second embodiment of the present invention will be explained with reference to FIGS. 3 and 4.

Although the polarizer is attached to the plastic substrate after cutting and dividing the substrates into the liquid crystal panels in the first embodiment, the second embodiment describes a method for manufacturing the liquid crystal panel in which a polarization function is previously given to the plastic substrate.

A counter substrate 300 of this embodiment shown in FIG. 3, which uses a plastic substrate 301 having a polarizer function (hereinafter, referred to as a polarizer-cum-plastic substrate 301), is assembled to the panel in accordance with a step flow shown in FIG. 4. An exemplified method will be described in detail below. Note that a method for manufacturing a CF-on-TFF substrate 100 is the same as that of the first embodiment and therefore, the explanation thereof is omitted.

First, a polarizer-cum-plastic substrate 301 having a film thickness of 0.1 to 0.7 mm is fixed to a glass substrate having a plate thickness of 0.4 to 1.1 mm (not shown) by adhesive bonding, negative pressure suction (method for generating negative pressure to suction the plastic substrate) or the like. A thickness of the glass substrate is optionally selected such that an aggregate thickness of the glass and plastic substrates after the polarizer-cum-plastic substrate is attached to the glass substrate does not require a specific modification of manufacturing steps. Furthermore, when the glass substrate and the polarizer-cum-plastic substrate are adhered to each other, a re-peelable pressure sensitive adhesive (pressure-sensitive adhesive which facilitates peel-off) such as a cellophane tape or a seal selected from a group of materials such as a natural-rubber-based adhesive, an acrylic adhesive, a synthetic-rubber-based adhesive, a silicone-based adhesive is applied to a surface of the glass substrate on a side thereof on which an adhesive should be located by a spin coating, a printing method or the like and, thereafter, the polarizer-cum-plastic substrate 301 is adhered to the glass substrate. Note that silicone or the like may be applied to a surface of the polarizer-cum-plastic substrate 301 on which an adhesive should be located to facilitate peeling off performed in a later step. Furthermore, the glass substrate and the polarizer-cum-plastic substrate 301 are not required to have the same area and the polarizer-cum-plastic substrate 301 may be made slightly larger than the glass substrate to facilitate the peeling off in a later step.

Subsequently, the common electrode 312 made of a transparent metal is formed on the polarizer-cum-plastic substrate 301 by performing a vacuum sputtering or by applying a transparent resist containing ITO particles or the like to the polarizer-cum-plastic substrate 301. In this case, the heat treatment for transforming the deposited or applied film from the amorphous state to the crystalline state is performed at a temperature of not greater than the heat-resistant temperature of the polarizer-cum-plastic substrate 301 regardless of a state of film, i.e., during and after formation of film.

Subsequently, a method for assembling the TFT substrate 100 and the counter substrate 300 in manufacturing steps of panel is explained.

First, a material made of polyimide or the like for an orientation film is uniformly applied-by printing, coating or the like to predetermined areas to have a predetermined film thickness and, then, baked, the predetermined areas being the surfaces of the TFT substrate 100 and the counter substrate 300 on sides thereof on which a liquid crystal 115 located, in more detail, on which the pixel electrode 112 and the common electrode 312 are located, respectively. In this case, the baking is performed at a temperature of not greater than the heat-resistant temperature of plastic at least with respect to the polarizer-cum-plastic substrate 301.

Subsequently, to align the liquid crystal 115 in a constant direction, the materials for the orientation films formed on the surfaces of respective substrates are rubbed with a cloth or the like so as to form the orientation films 114 (rubbing treatment).

Thereafter, a seal material of an ultraviolet curing type is drawn on the TFT substrate 100 by a dispenser method and the liquid crystal 115 is filled in a region surrounded by the seal by injecting the liquid crystal 115 using a dropping technique. Although an example in which the seal is formed on the TFT substrate 100 and the liquid crystal 115 is filled in the region surrounded by the seal is described in this embodiment, the method is not limited to such an example and the seal may be formed on the counter substrate 300 and the liquid crystal 115 may be filled in a region defined by the seal.

Then, the counter substrate 300 is disposed overlapping the TFT substrate 100 in which the liquid crystal 115 is filled and ultra-violet rays are irradiated to the seal portion from a side of the counter-substrate 300 to cure the seal.

Thereafter, the glass substrate adhered to the polarizer-cum-plastic substrate 301 is removed from the polarizer-cum-plastic substrate 301 in the following manner. That is, in the case where the glass substrate is fixed to the polarizercum-plastic substrate 301 by adhesion, the glass substrate is removed from the polarizer-cum-plastic substrate 301 in such a manner that an end portion of the glass substrate and an end portion of the polarizer-cum-plastic substrate 301 are made apart from one another in directions opposite to each other, which operation is an operation similar to that could be observed in peeling off the cellophane tape and the seal. On the other hand, in the case where the glass substrate is fixed to the polarizer-cum-plastic substrate 301 by negative pressure suction, the glass substrate and the polarizer-cum-plastic substrate 301 are made apart from each other by breaking the negative pressure into an air pressure in a nondestructive manner. Thereafter, the substrate consisting of the TFT substrate 100 and the counter substrate 300 adhered to each other is cut into specific size of substrates and a polarizer 116 for a TFT substrate and a polarizer 216 for a counter substrate are respectively adhered to surfaces of the substrates on sides thereof opposite to opposing surfaces of the substrates, thus completing formation of liquid crystal panel. Note that the glass substrate removed from the polarizer-cum-plastic substrate in a nondestructive manner is available for re-use after cleaning the surface of the glass substrate. In this case, the adhesive or the like adhered to the glass substrate is removed using an alcohol-based or petroleum-based organic solvent.

Also in this embodiment, the bending of polarizer-cum-plastic substrate adversely affecting steps for manufacturing a liquid crystal panel can be prevented, thereby allowing a polarizer-cum-plastic substrate to be processed in the same manner as that could be employed to process a glass substrate.

As has been described heretofore, according to the method for manufacturing a liquid crystal display device of the present invention, the TFT and the color filter are formed on the glass substrate in the active-matrix substrate and the common electrode is formed on the polarizer-cum-plastic substrate in the counter substrate that employs a polarizer-cum-plastic substrate as a substrate. In this case, according to the manufacturing steps for completing formation of the counter electrode using the polarizer-cum-plastic substrate as a counter substrate of a liquid crystal panel, in the steps ranging from the step for forming the common electrode on the polarizer-cum-plastic substrate to the step prior to the step for cutting and dividing the counter substrate 200 into the liquid crystal panel units, the glass substrate is adhered to the polarizer-cum-plastic substrate as a support substrate for the polarizer-cum-plastic substrate. Accordingly, the bending of polarizer-cum-plastic substrate adversely affecting steps for manufacturing a liquid crystal panel can be prevented, thereby allowing a polarizer-cum-plastic substrate to be processed in the same manner as that could be employed to process a glass substrate.

What is claimed is:

1. A method for manufacturing a liquid crystal display device, comprising:

a step for disposing a TFT substrate and a counter substrate facing said TFT substrate apart a predetermined distance from each other; and a step for filling a space between said TFT substrate and said counter substrate with a liquid crystal, said liquid crystal display device being constructed such that at least one of said TFT substrate and said counter substrate consists of a plastic substrate, said method further being constructed such that said method comprises a substrate separation step for cutting and dividing a combined substrate consisting of said TFT substrate and said counter substrate, both substrates interposing said liquid crystal therebetween, into substrate units, and one of surfaces of said plastic substrate is supported by a support substrate until said combined substrate is cut and divided.

2. The method for manufacturing a liquid crystal display device according to claim 1, wherein a method for manufacturing said TFT substrate comprises:

a step for forming a thin film transistor and a wiring on a first substrate;

a step for depositing a protective film covering said thin film transistor and said wiring on said first substrate;

a step for forming a color layer corresponding to said thin film transistor and a black matrix shielding light from being irradiated onto said thin film transistor on said protective film;

a step for depositing a flattening film covering said color layer and said black matrix on said protective film;

a step for opening a part of said protective film and said flattening film to form a contact hole reaching a source electrode of said thin film transistor in said protective film and said flattening film;

a step for forming a transparent pixel electrode covering said contact holes and connected to said source electrode on said the flattening film;

a step for forming a spacer on said flattening film;

a step for forming an orientation film covering said transparent pixel electrode and said spacer on said flattening film, and subsequently, rubbing said orientation film;

a step for forming a seal material to surround a predetermined region on said orientation film; and a step for dropping a liquid crystal into said region surrounded by said seal material constituting said orientation film, and a method for manufacturing said counter substrate comprises:

a step for covering a second substrate with a transparent electrode and adhering a support substrate to a surface of said second substrate, said surface being located on a side of said second substrate opposite to said transparent electrode; and a step for forming a material for an orientation film on said transparent electrode, and sequentially, rubbing said orientation film, and said method for manufacturing a liquid crystal display device further comprising:

a step for disposing said TFT substrate and said counter substrate overlapping each other such that said orientation films of said TFT substrate and said counter substrate face each other, and then, making said orientation film of said counter substrate contact said spacer and said seal material of said TFT substrate;

a step for curing said seal material to make said TFT substrate and said counter substrate adhere to each other, thereby forming a semi-completed panel;

a step for removing said second substrate from said support substrate, a step for cutting and dividing said semi-completed panel into panel units; and a step for attaching a polarizer to a surface of at least said first substrate out of said first and second substrates constituting said panel unit, said surface being located opposite to said liquid crystal, and said support substrate being previously attached to a surface of said second substrate, said surface being located opposite to said transparent electrode, before said step for forming said transparent electrode on said second substrate.

3. The method for manufacturing a liquid crystal display device according to the claim 1, wherein said second substrate is formed of a plastic substrate.

4. The method for manufacturing a liquid crystal display device according to the claim 2, wherein another polarizer is attached to a surface of said second substrate, said surface of said second substrate being located opposite to said liquid crystal, in said step for attaching a polarizer to a surface of at least said first substrate out of said first and second substrates constituting said panel unit, said surface of at least said first substrate being located opposite to said liquid crystal.

5. The method for manufacturing a liquid crystal display device according to the claim 2, wherein said polarizer is attached only to said surface of said first substrate in said step for attaching a polarizer to a surface of at least said first substrate out of said first and second substrates constituting said panel unit, said surface of at least said first substrate being located opposite to said liquid crystal, and said second substrate is formed of a polarizer-cum-plastic substrate.

6. The method for manufacturing a liquid crystal display device according to the claim 2, wherein said support substrate is formed of a glass substrate.

* * * * *